United States Patent
Kondo et al.

(10) Patent No.: US 8,020,079 B2
(45) Date of Patent: Sep. 13, 2011

(54) DECODER DEVICE, DECODING METHOD AND MAGNETIC DISK DEVICE

(75) Inventors: Yosuke Kondo, Fussa (JP); Kenji Yoshida, Akishima (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/790,411

(22) Filed: May 28, 2010

(65) Prior Publication Data

US 2010/0306617 A1    Dec. 2, 2010

(30) Foreign Application Priority Data

May 28, 2009    (JP) ................. 2009-129259

(51) Int. Cl.
*H03M 13/00* (2006.01)
*G06F 11/00* (2006.01)

(52) U.S. Cl. ........................ 714/780; 714/800

(58) Field of Classification Search .................. 714/752, 714/755, 774, 780, 794–795, 800–801; 375/262
See application file for complete search history.

(56) References Cited

U.S. PATENT DOCUMENTS

| 7,178,080 B2 * | 2/2007 | Hocevar ......................... 714/752 |
| 7,184,486 B1 * | 2/2007 | Wu et al. ...................... 375/262 |
| 7,734,981 B2 * | 6/2010 | Esumi et al. ................. 714/752 |

FOREIGN PATENT DOCUMENTS

| JP | 2003-007009 A | 1/2003 |
| JP | 2006-019889 A | 1/2006 |
| JP | 2006-191378 | 7/2006 |
| JP | 2006-191378 A | 7/2006 |
| JP | 2008-539623 | 11/2008 |
| WO | WO 2006/117135 A1 | 11/2006 |

OTHER PUBLICATIONS

Notification of Reasons for Rejection mailed by Japan Patent Office on Jul. 27, 2010 in the corresponding Japanese patent application No. 2009-129259.
Notification of Reasons for Rejection mailed by Japan Patent Office on Nov. 9, 2010 in the corresponding Japanese patent application No. 2009-129259.
Information Sheet for IDS. (2008).

* cited by examiner

*Primary Examiner* — Shelly A Chase
(74) *Attorney, Agent, or Firm* — Knobbe, Martens, Olson & Bear LLP

(57) ABSTRACT

According to one embodiment, a decoder device includes a decoder configured to decode a to-be-decoded sequence by performing an iterative decoding process and to perform a parity check of a decoding result using a check matrix, a detector configured to detect that the to-be-decoded sequence is a non-code word based on a parity check result for each row of the check matrix by the decoder, and a controller configured to control the decoder according to a detection result of the detector.

15 Claims, 4 Drawing Sheets

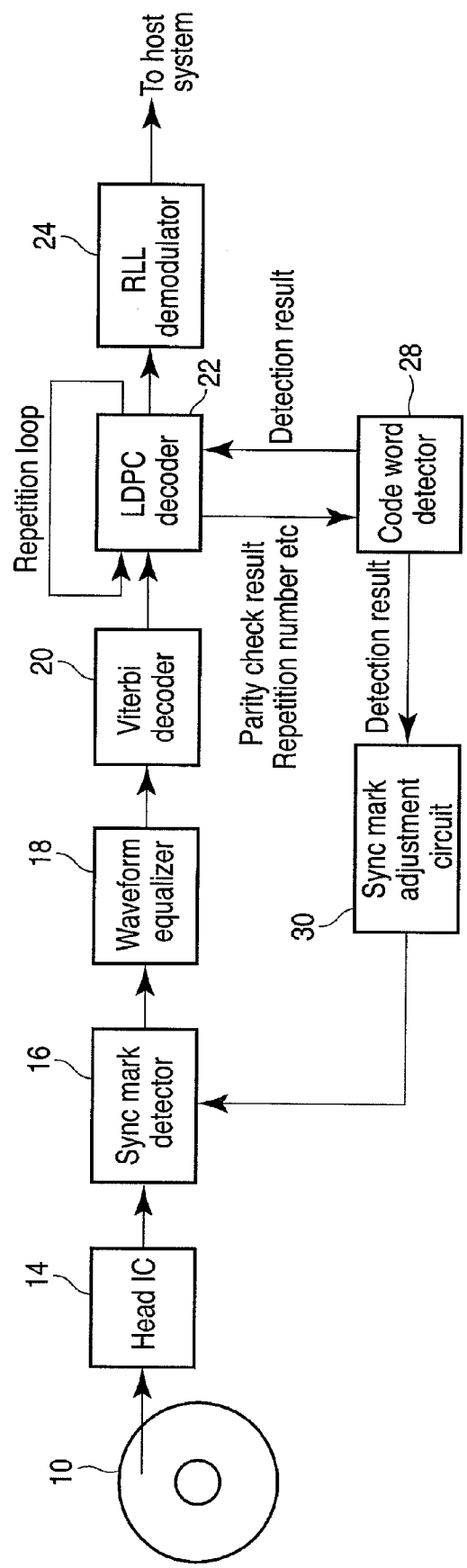
F I G. 1

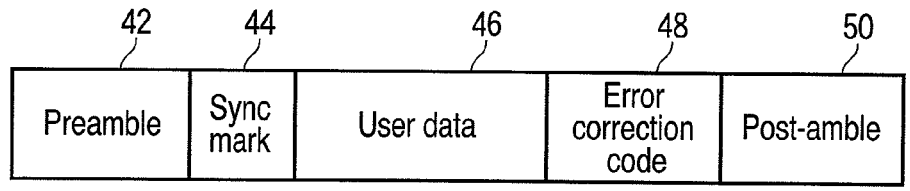
F I G. 2
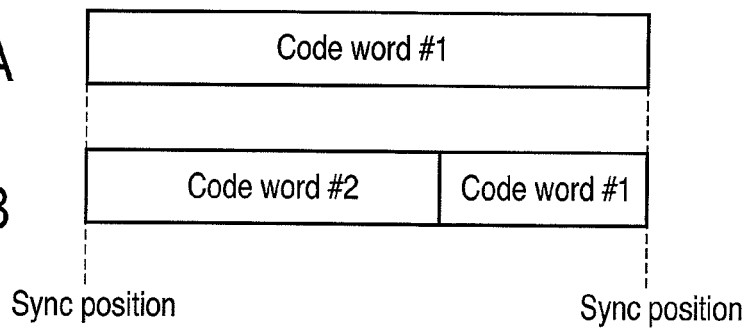
F I G. 3A
F I G. 3B
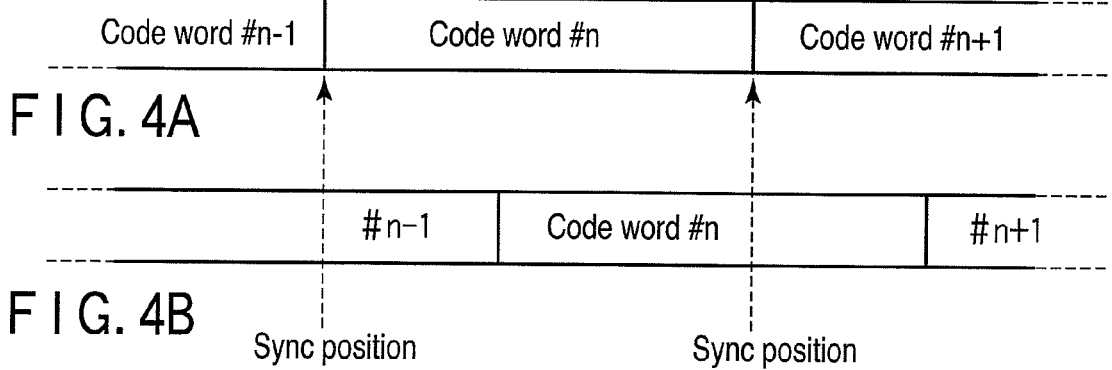
F I G. 4A
F I G. 4B

DECODER DEVICE, DECODING METHOD AND MAGNETIC DISK DEVICE

CROSS-REFERENCE TO RELATED APPLICATIONS

This application is based upon and claims the benefit of priority from Japanese Patent Application No. 2009-129259, filed May 28, 2009; the entire contents of which are incorporated herein by reference.

FIELD

Embodiments described herein relate generally to a decoder device configured to decode data encoded by an LDPC (Low Density Parity Check) coding system, decoding method and magnetic disk device.

BACKGROUND

An error may occur in digital data due to external noise or the like at the recording and reproducing time of digital data. Therefore, an error correction code for detecting and correcting the error is used. In the error correction coding, redundant data is added to data at the encoding time and an error of data is corrected based on the redundant data at the decoding time.

As one example of the error correction code, an LDPC code is proposed. The LDPC code is a block code defined by a sparse check matrix and decoded by an iterative decoding process. For example, the LDPC code has an advantage that it has an excellent decoding performance close to Shannon Limit and a structure capable of performing a parallel process suitable for high-speed decoding by use of hardware.

However, when a to-be-decoded sequence is far from a valid code word, an error cannot be corrected even if the decoding process is iteratively performed many times. Therefore, a decoder device that stops a decoding operation at the initial stage of the decoding process for a code word that cannot be decoded is proposed in Jpn. PCT National Publication No. 2008-539623.

In Jpn. PCT National Publication No. 2008-539623, a method for controlling a process of decoding an LDPC coded code word expressed by a bipartite graph between check nodes and variable nodes is described. In this case, each time a message is exchanged between the variable node and the check node, a first total sum of all of messages (Log Likelihood Ratio) received by the variable node is calculated, and a second total sum of all of the absolute values of the first total sums and the decoding process is interrupted in a case where the second total sum decreases or does not vary between two iterative processes and a preset threshold condition is satisfied.

However, the method in Jpn. PCT National Publication No. 2008-539623 has a problem that it takes a long time for calculations because the second total sum used as a criterion for determining whether the decoding process is interrupted or not makes it necessary to calculate the first total sum of all of incident messages received by the variable node for each variable node.

BRIEF DESCRIPTION OF THE DRAWINGS

FIG. 1 is an exemplary block diagram showing the configuration of a data reading system of a hard disk device according to an embodiment.

FIG. 2 is an exemplary diagram showing a sector data structure.

FIG. 3A and FIG. 3B are exemplary diagrams showing sector data structures when a sudden write termination happens due to a power loss or a shock detection.

FIG. 4A and FIG. 4B are exemplary diagrams showing sector data structures when a sync mark is mistakenly detected at the read time.

DETAILED DESCRIPTION

Figure 5:
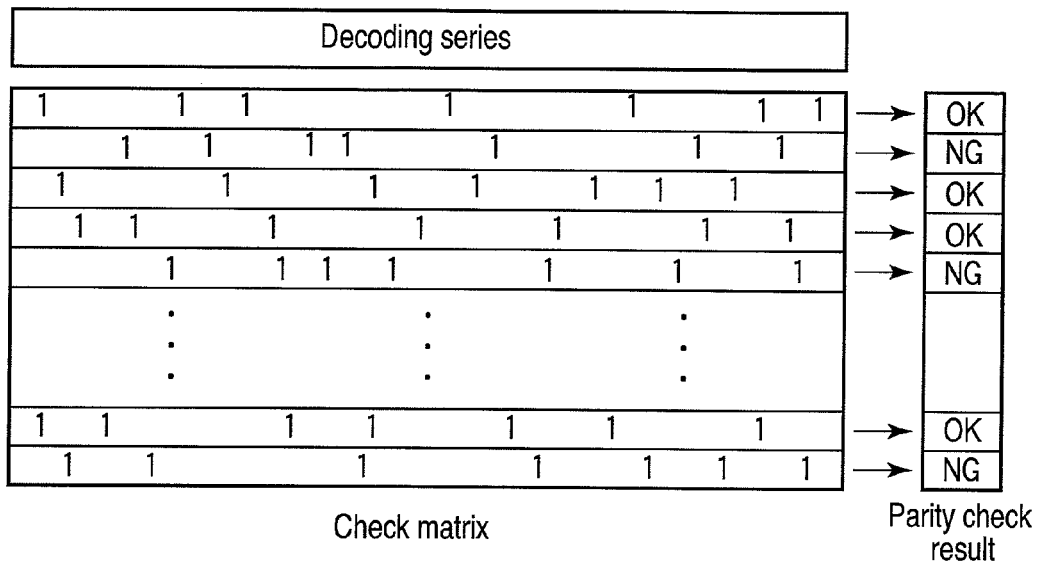
FIG. 5 is an exemplary diagram showing the state of a parity check in an LDPC decoding process.

In general, according to one embodiment, a decoder device comprises a decoder configured to decode a to-be-decoded sequence by performing an iterative decoding process and to perform a parity check of a decoding result using a check matrix; a detector configured to detect that the to-be-decoded sequence is a non-code word based on a parity check result for each row of the check matrix by the decoder; and a controller configured to control the decoder according to a detection result of the detector.

Embodiments are described with reference to a decoder for a magnetic disk apparatus, such as a hard disk device.

FIG. 1 is a block diagram showing the configuration of a data reading system of a hard disk device according to a first embodiment. The data reading system is a system that reads a signal recorded in a disk and transfers the signal to a host system such as a personal computer. A data recording system that writes data transferred from the host system on the disk and a servo control system associated with address control on the disk are not directly related to decoding, the known configurations can be used, and therefore, the explanation thereof is omitted. Further, although not shown in the drawing, a CPU configured to control the whole portion of FIG. 1 is also contained in the data reading system.

The hard disk device may be a built-in type device that is arranged in a casing of a personal computer used as a host system or an external device arranged outside the casing.

For example, the upper surface of a magnetic disk 10 makes a recording surface on which data is magnetically recorded. A magnetic head (not shown) is arranged in correspondence to the recording surface of the magnetic disk 10. The magnetic head is used for writing data on the magnetic disk (data recording) and reading data from the magnetic disk 10 (data reading). The undersurface of the magnetic disk 10 also makes a recording surface and a head of the same type is arranged in correspondence to the recording surface. Further, a hard disk device comprising the single magnetic disk 10 is shown but a hard disk device having plural magnetic disks 10 mounted and arranged thereon can also be used.

The magnetic disk 10 is rotated at high speed by a spindle motor that is not shown in the drawing. The magnetic head is mounted on an actuator (not shown) used as a head moving mechanism.

A signal read by the magnetic head is supplied to a head amplifier (head IC) 14 and a read signal is detected and amplified.

An output of the head amplifier 14 is supplied to a sync mark detector 16 after A/D (analog/digital) conversion and then a sync mark of sector data is detected.

One example of the sector data structure is shown in FIG. 2. The sector data comprises a preamble 42, sync mark 44, user data 46, error correction code (ECC) 48 and post-amble 50. The preamble 42 is a cyclic pattern and enables to sample the playback signal at the right timing. The sync mark 44 is a predetermined bit pattern to detect a start position of the user data 46 at the reading. The user data 46 is data supplied from a host system and is encoded by a run-length-limited (RLL) modulator to guarantee that there is long run of zeros or ones. The ECC data 48 is error correction data and stronger correction ability can be attained as the data length thereof increases. Data obtained by attaching the error correction code 48 to the user data 46 is used as a code word whose error is to be corrected. The post-amble 50 is used to terminate ML determination of Partial Response Maximum Likelihood (PRML) and is set to approximately 5 to 10 bytes.

A reproduction signal accompanied by a sync position detected by the sync mark detector 16 is supplied to a waveform equalizer 18. The waveform equalizer 18 is constituted by a Finite Impulse Response type (FIR-type) filter that makes the reproduction signal from the magnetic head conform (equalizes the waveform) to a PR characteristic used. Amplification of a noise component by equalization can be suppressed by selecting the PR characteristic that is similar to the reproduction signal characteristic of the magnetic disk 10. The waveform equalizer 18 equalizes the waveform of a reproduction signal to a response waveform (partial response waveform signal) corresponding to the target PR characteristic (PR class).

An output of the waveform equalizer 18 is supplied to a maximum likelihood decoder (Viterbi decoder) 20 that is one type of an error correction circuit. The Viterbi decoder in the recording/reproducing system using a Low Density Parity Check (LDPC) code does not utilize a Viterbi decoder that makes hard-decision but utilizes a soft-decision Viterbi decoder that outputs the probability of "0" or "1" in log domain. Therefore, the Viterbi decoder 20 outputs Log-Likelihood-Ratio (LLR) values.

The soft-decision value of a to-be-decoded sequence obtained by the Viterbi decoder 20 is iteratively subjected to an LDPC decoding process plural times by the LDPC decoder 22 and the decoding result is supplied to a RLL demodulator 24.

In the RLL demodulator 24, an inverted process (demodulation) with respect to RLL modulation is performed to obtain the original data supplied from the host system. After this, for example, the data is supplied to the host system via an Advanced Technology Attachment (ATA) or Integrated Drive Electronics (IDE) bus.

A parity check result and iteration number are supplied from the LDPC decoder 22 to a code word detector 28 and the detection result is supplied from the code word detector 28 to the LDPC decoder 22. The detection result of the code word detector 28 is also supplied to a sync mark adjusting circuit 30. The sync mark adjusting circuit 30 controls the sync mark detector 16 to adjust the detection position of the sync mark 44.

Next, the operation of the embodiment is explained.

Generally, when a sudden write termination happens due to a power loss or a shock detection in the magnetic disk device, sector data on the disk is overwritten halfway and, as shown in FIG. 3B, sector data may be constituted by a code word #1 and code word #2. When the write operation is correctly performed, the entire portion of sector data is set to a code word #1 as shown in FIG. 3A. Since an LDPC parity bit of the code word #1 and an LDPC parity bit of the code word #2 are quite different from each other, the LDPC decoding condition for sector data as shown in FIG. 3B is not satisfied and the data collapses. As a result, the LDPC decoder cannot converge to a valid code word even if the LDPC decoding process is iteratively performed many times.

Further, when in a bad SNR (Signal to Noise Ratio) condition, there is a possibility that a sync mark cannot be correctly detected but mistakenly regards user data bit pattern as a sink mark pattern at the read time. In such a case, the sector data read is far from a valid code word, as shown in FIG. 4B. FIG. 4A shows sector data when a sync mark is correctly detected. Also, in the case of FIG. 4B, the LDPC decoder cannot converge to a valid codeword even if the LDPC decoding process is iteratively performed.

Thus, when read data is constituted not by a single code word but by plural code words and the correction thereof is clearly impossible, the determination thereof is made at an early stage and the LDPC decoding process is terminated or the LDPC decoding process can be efficiently performed by shifting a sync pattern at the re-read (retry) time. Thus, the performance of the read operation can be enhanced.

In FIG. 5, the state of a parity check in the LDPC decoding process is shown. A parity check is made in the row direction of the check matrix by using the hard-decision result of a position of a decoding sequence corresponding to positions in which "1"s are set and whether a parity equation is satisfied or not is determined. If the hard-decision result is erroneous, there occurs a high probability that the parity check result becomes NG. If no error is present in the decoding sequence, all of the parity check results become OK. If the number of errors lies within a correctable range even when errors are present, the number of parity check results that become OK increases while the LDPC decoding process is iteratively performed. Finally, if no error is present, all of the results become OK. If the decoding sequence is constituted by the code word #1 and code word #2 as shown in FIG. 3B or FIG. 4B, it is considered that some of the parity equations will not be satisfied and some of the parity check results will become NG even if the LDPC decoding process is iteratively performed many times.

Figure 6:
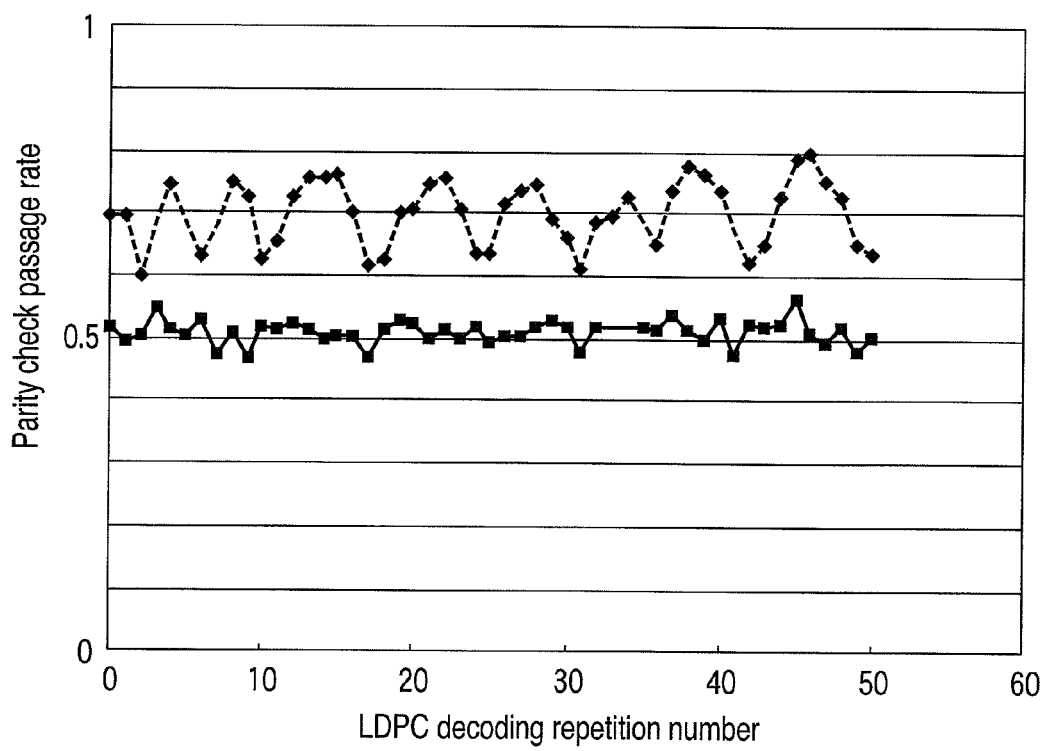
FIG. 6 is an exemplary diagram showing the state of transition of a parity check passage rate and the iteration number of LDPC decoding processes.

FIG. 6 shows the experimental result obtained by checking the state of transition of a parity check passage rate and the iteration number of LDPC decoding processes near an error rate $10^{-4}$. The parity check passage rate is a rate of the number of rows on which the parity check results become OK with respect to the total number of rows of the check matrix. If the decoding sequence is a code word itself and the number of errors is within a correctable range, all of the parity check results will become OK while the LDPC decoding process is iteratively performed, that is, the passage rate becomes 1.

A broken line in FIG. 6 indicates a case wherein the decoding sequence is a code word itself but the number of errors is large and the errors cannot be corrected. A solid line in FIG. 6 indicates a case wherein a decoding sequence is constituted by mixed code words, that is, it is not a code word.

As shown by the broken line, if data is a code word although it cannot be corrected, the passage rate does not become 1 even if the LDPC decoding process is iteratively performed, but the passage rate is set at a relatively large value from the beginning (approximately 0.7) and the passage rate increases or decreases with the initial value set as a center and varies while the LDPC decoding process is iteratively performed. However, the passage rate always exceeds 0.5 and the average value thereof is approximately 0.7. On the other hand, as shown by the solid line, if data cannot be corrected and is not a code word, the passage rate is set at approximately 0.5 from the beginning and is not much changed even if the LDPC decoding process is iteratively performed, but it may become smaller than 0.5. On average, the passage rate is approximately 0.5. The parity check passage rate will vary depending on the error rate or the way several code words, for example, two code words are mixed, but it is provided a criterion used to determine whether sector data now read is a code word or not (for example, a variation (difference between the maximum value and the minimum value) in a constant time in which the passage rate becomes smaller than a threshold value is set in a certain criterion range). Determination that data is a non-code word can be made at an early stage according to the criterion, an operation of iterating the useless decoding process can be stopped and the retry operation of the read operation from the magnetic disk can be efficiently performed. The code word detector 28 shown in FIG. 1 receives a parity check result and iteration number as inputs from the LDPC decoder 22 and can detect that the data is not a code word (it is a non-code word) in the instant that the parity check passage rate becomes smaller than a threshold value (for example, 0.5) in the iterating process, for example. Alternatively, the code word detector 28 can detect that the data is not a code word when no variation is detected in the parity check passage rate in the iterating process of several decoding processes at the initial stage, for example.

Figure 7:
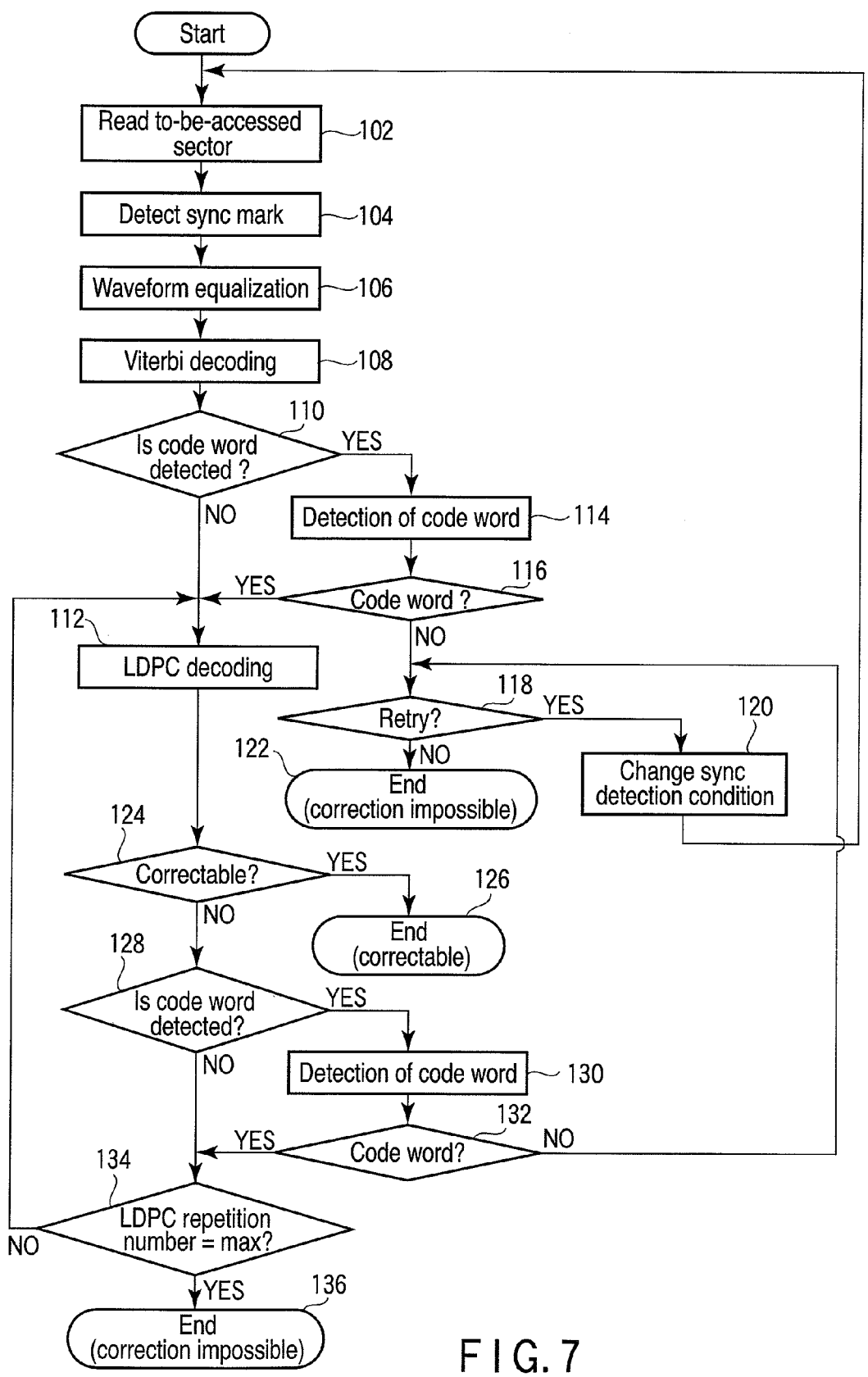
FIG. 7 is an exemplary flowchart for illustrating an LDPC decoding operation of this embodiment.

FIG. 7 is a flowchart of the LDPC decoding process. Although not shown in FIG. 1, to-be-accessed sector data of the magnetic disk 10 is read by means of the magnetic head in Block 102. The sync mark detector 16 detects a sync mark 44 from read data in Block 104. The waveform equalizer 18 equalizes the waveform in Block 106 and the Viterbi decoder 20 performs a Viterbi decoding process in Block 108.

A CPU (that is not shown in FIG. 1 and a process performed by the CPU may be automatically performed by use of hardware or the process may be shared by the CPU and hardware) determines in Block 110 whether it is code word detection timing or not. If it is not the code word detection timing, the LDPC decoder 22 subjects an output of the Viterbi decoder 20 to an LDPC decoding process in Block 112. If it is the code word detection timing, the code word detector 28 performs a code word detection process in Block 114 and the detection result is supplied from the code word detector 28 to the LDPC decoder 22.

The CPU determines whether or not sector data is a code word based on the detection result in Block 116. If it is not detected that the data is a non-code word, the process proceeds to Block 112 and the LDPC decoding process is performed.

When it is detected that the data is a non-code word, whether or not the read operation is retried is determined in Block 118. For example, if the retry number is not larger than a preset upper limit used as the determination criterion, it is possible to determine that the retry operation is performed.

If it is determined that the retry operation is not performed, it is determined in Block 122 that data cannot be corrected and the LDPC decoding process is terminated. If it is determined that the retry operation is performed, a sync mark pattern is shifted by the sync mark adjustment circuit 30 in Block 120, a sync mark detection process (Block 104) is performed again and the operation after waveform equalization is repeated. In Block 120, the sync mark 44 may be forcedly detected by firmware or a sync mark position may be shifted to some extent by hardware in addition to the process of shifting the sync mark pattern by the sync mark adjustment circuit 30. That is, it is satisfactory if the error detection state as shown in FIG. 4B is avoided or a normal detection state as shown in FIG. 4A is obtained. It is possible to attempt to change various sync mark detection methods. By the above retry operation, there occurs a high probability that the detection result of a code word becomes "YES" in Block 116.

If the LDPC decoding process is performed once in Block 112, whether an error is present or not is determined in Block 124, and if an error is present, whether the number of errors is not larger than the number of correctable errors or not is also determined in Block 124. If it is determined that an error is correctable, the LDPC decoding process is correctly terminated in Block 126.

If it is determined that an error is not correctable, the CPU determines in Block 128 whether or not it is timing for detecting a code word or not. If it is not the code word detection timing, whether or not the iteration number of LDPC decoding processes is smaller than or equal to an upper limit number is determined in Block 134. If the iteration number is not larger than the upper limit number, the process returns to Block 112 and the LDPC decoder 22 subjects an output of the Viterbi decoder 20 to an LDPC decoding process. If the iteration number is larger than the upper limit number, it is determined in Block 136 that an error is not correctable and the LDPC decoding process is terminated.

If it is the code word detection timing (YES in Block 128), the code word detector 28 performs a code word detection process in Block 130 and the detection result is supplied from the code word detector 28 to the LDPC decoder 22. The CPU determines in Block 132 whether sector data is a code word or not based on the detection result. If it is detected that the data is a non-code word, the process returns to Block 118 and whether the read operation is retried or not is determined. If it is not determined that the data is a non-code word, the process proceeds to Block 134 and whether or not the iteration number of LDPC decoding processes is smaller than or equal to the upper limit number is determined.

As explained above, according to this embodiment, whether or not read sector data is a code word is detected in the course of the LDPC decoding process. If it is detected that the data is not a code word, the probability that an error cannot be corrected even if the LDPC decoding process is iteratively performed becomes low, and therefore, the LDPC decoding process is interrupted or a sync mark is detected again to prevent a non-code word from being detected based on erroneous detection of a sync mark. Therefore, a wasteful process and time for iterating an LDPC decoding process for a non-decodable code word can be prevented. Further, since a non-code word is detected based on the parity check passage rate in the course of the LDPC decoding process, the calculation becomes simple and a time required for the calculation becomes short. As a result, when a sector that is only partially written due to power interruption or interruption of writing during the write operation of the magnetic disk device or a sector that is clearly impossible to be decoded because of erroneous detection of a sync mark 44 is read, an unwanted retry operation and LDPC decoding process can be avoided and the performance of the read operation of the magnetic disk device can be enhanced.

Thus, a to-be-decoded sequence can be detected not to be a code word with the simple configuration and the LDPC decoding process can be controlled according to the detection result.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A decoder device comprising:
    a decoder configured to decode a to-be-decoded sequence by performing an iterative decoding process, and to perform a parity check of a decoding result using a check matrix;
    a detector configured to detect whether the to-be-decoded sequence is an LDPC coded data based on a rate of the number of rows which satisfies a parity equation with respect to a total number of rows of the check matrix by the decoder; and
    a controller configured to control the decoder according to a detection result of the detector.

2. The decoder device of claim 1, wherein the detector is configured to detect whether the to-be-decoded sequence is the LDPC coded data based on a comparison result between the rate and a preset threshold value.

3. The decoder device of claim 1, wherein the detector is configured to detect whether the to-be-decoded sequence is the LDPC coded data based on whether a difference between a maximum value and a minimum value of the rate within a predetermined time is within a preset range.

4. The decoder device of claim 1, wherein the detector is configured to detect whether the to-be-decoded sequence is the LDPC coded data before performing the iterative decoding process.

5. The decoder device of claim 1, wherein the detector is configured to detect whether the to-be-decoded sequence is the LDPC coded data each time the iterative decoding process is performed.

6. The decoder device of claim 1, wherein
    the controller is configured to change a sync mark detection condition and to cause the decoder to retry detection of the sync mark of the to-be-decoded sequence when it is detected that the to-be-detected sequence is not the LDPC coded data.

7. The decoder device of claim 1, wherein the controller is configured to interrupt the iterative decoding process of the decoder when it is detected that the to-be-detected sequence is not the LDPC coded data.

8. A decoder method comprising:
    decoding a to-be-decoded sequence by performing an iterative decoding process and performing a parity check of a decoding result using a check matrix;
    detecting whether the to-be-decoded sequence is an LDPC coded data based on a rate of the number of rows which satisfies a parity equation with respect to a total number of rows of the check matrix by the decoding; and
    controlling the decoding according to a detection result of the detecting.

9. The decoder method of claim 8, wherein the detecting comprises detecting whether the to-be-decoded sequence is the LDPC coded data based on a comparison result between the rate and a preset threshold value.

10. The decoder method of claim 8, wherein the detecting comprises detecting whether the to-be-decoded sequence is the LDPC coded data based on whether a difference between a maximum value and a minimum value of the rate within a predetermined time is within a preset range.

11. A magnetic disk device comprising:
    a magnetic head configured to read data from a magnetic disk;
    an extractor configured to extract a to-be-decoded sequence from data output by the magnetic head;
    a decoder configured to decode the extracted to-be-decoded sequence by performing an iterative decoding process, and to perform a parity check of a decoding result using a check matrix;
    a detector configured to detect whether the extracted to-be-decoded sequence is an LDPC coded data based on a rate of the number of rows which satisfies a parity equation with respect to a total number of rows of the check matrix by the decoder; and
    a controller configured to control the decoder according to a detection result of the detector.

12. The magnetic disk device of claim 11, wherein the detector is configured to detect whether the to-be-decoded sequence is the LDPC coded data based on a comparison result between the rate and a preset threshold value.

13. The magnetic disk device of claim 11, wherein the detector is configured to detect whether the to-be-decoded sequence is the LDPC coded data based on whether a difference between a maximum value and a minimum value of the rate within a predetermined time is within a preset range.

14. The magnetic disk device of claim 11, wherein
    the extractor is configured to compare the data output by the magnetic head with a preset sync mark pattern to detect a sync mark and to extract the user data based on a detected sync mark, and
    the controller is configured to change a sync mark detection condition of the extractor and to cause the extractor to retry detection of the sync mark when it is detected that the to-be-detected sequence is not the LDPC coded data.

15. The magnetic disk device of claim 11, wherein the controller is configured to interrupt the iterative decoding process of the decoder when it is detected that the to-be-detected sequence is not the LDPC coded data.

* * * * *